US007969558B2

(12) United States Patent
Hall

(10) Patent No.: US 7,969,558 B2
(45) Date of Patent: Jun. 28, 2011

(54) HIGH DEFINITION LIDAR SYSTEM

(75) Inventor: David S. Hall, Los Altos Hill, CA (US)

(73) Assignee: Velodyne Acoustics Inc., Morgan Hill, CA (US)

( * ) Notice: Subject to any disclaimer, the term of this patent is extended or adjusted under 35 U.S.C. 154(b) by 958 days.

(21) Appl. No.: 11/777,802

(22) Filed: Jul. 13, 2007

(65) Prior Publication Data

US 2010/0020306 A1    Jan. 28, 2010

Related U.S. Application Data

(60) Provisional application No. 60/807,305, filed on Jul. 13, 2006.

(51) Int. Cl.
  *G01C 3/08*    (2006.01)
(52) U.S. Cl. ............... 356/5.01; 356/4.01; 356/141.5
(58) Field of Classification Search .................. 356/3.1, 356/4.01, 5.15, 28, 139.09, 141.1, 141.3, 356/141.5
  See application file for complete search history.

(56) References Cited

U.S. PATENT DOCUMENTS

| | | | |
|---|---|---|---|
| 4,834,531 A | 5/1989 | Ward | |
| 4,862,257 A | 8/1989 | Ulich | |
| 6,442,476 B1* | 8/2002 | Poropat | 701/207 |
| 6,593,582 B2 | 7/2003 | Lee et al. | |
| 6,636,300 B2 | 10/2003 | Doemens et al. | |
| 6,646,725 B1 | 11/2003 | Eichenger et al. | |
| 7,248,342 B1 | 7/2007 | Degnan | |
| 2002/0003617 A1 | 1/2002 | Doemens et al. | |
| 2003/0043363 A1 | 3/2003 | Jamieson et al. | |
| 2003/0090646 A1 | 5/2003 | Riegl et al. | |
| 2006/0132635 A1 | 6/2006 | Land | |
| 2006/0197867 A1 | 9/2006 | Johnson et al. | |
| 2007/0035624 A1 | 2/2007 | Lubard et al. | |
| 2007/0219720 A1* | 9/2007 | Trepagnier et al. | 701/300 |
| 2008/0074640 A1 | 3/2008 | Walsh et al. | |

OTHER PUBLICATIONS

Hall, et al., "Team DAD Technical Paper," DARPA Grand Challenge 2005, XP-002543336, pp. 1-12; Aug. 26, 2005.
Maris Juberts, "Status report on next generation LADAR for driving unmanned ground vehicles" Mobile Robots XVII, edited by Douglas W. Gage, Proceedings of SPIE, vol. 5609, pp. 1-12, 2004.

* cited by examiner

*Primary Examiner* — Isam Alsomiri
(74) *Attorney, Agent, or Firm* — Black Lowe & Graham PLLC

(57) ABSTRACT

A lidar-based 3-D point cloud measuring system and method. An example system includes a base, a housing, a plurality of photon transmitters and photon detectors contained within the housing, a rotary motor that rotates the housing about the base, and a communication component that allows transmission of signals generated by the photon detectors to external components. The rotary component includes a rotary power coupling configured to provide power from an external source to the rotary motor, the photon transmitters, and the photon detectors. In another embodiment, the photon transmitters and detectors of each pair are held in a fixed relationship with each other. In yet another embodiment, a single detector is "shared" among several lasers by focusing several detection regions onto a single detector, or by using a single, large detector.

25 Claims, 20 Drawing Sheets

HIGH DEFINITION LIDAR SYSTEM

PRIORITY CLAIM

The application claims the benefit of U.S. Provisional Application Ser. No. 60/807,305 filed Jul. 13, 2006, the contents of which are hereby incorporated by reference.

BACKGROUND OF THE INVENTION

The use of a pulse of light to measure distance is well known. As is commonly used in devices such as a police speed detector, the basic concept is that of pulsing a laser emitter, which causes a burst of light to be emitted, usually focused through a lens or lens assembly. Then, the time it takes for that pulse of light to return to a detector mounted near the emitter is measured, and a distance can then be derived from that measurement with high accuracy.

When multiple pulses are emitted in rapid succession, and the direction of those emissions is somehow sequentially varied, each distance measurement can be considered a pixel, and a collection of pixels emitted and captured in rapid succession (called a "point cloud") can be rendered as an image or analyzed for other reasons such as detecting obstacles. Viewers that render these point clouds (today typically PC based) can manipulate the view to give the appearance of a 3-D image. While the data that comes back is lacking color or other characteristics, different schemes can be used to depict the distance measurements that allow the rendering device to show the 3-D image as if it were captured by a live action camera.

There exist a number of commercial products that can capture distance points in rapid succession and render a 2-D (i.e. single plane) point cloud. These instruments are often used in surveying, mapping, autonomous navigation, industrial applications, and for other purposes. Most of these devices rely on the use of a single laser emitter/detector combination combined with some type of moving mirror to effect scanning across at least one plane, as shown in FIG. 1.

Such devices are often used in industrial applications, as shown in FIG. 2. Note the scan lines emitting from the unit—the spinning mirror allows the single laser emitter/detector assembly to be aimed along this plane via the use of the rotating mirror.

Often, these mirrors are rotated at very fast speeds—in the thousands of RPMs. As stated above, this design inherently renders only a 2-D point cloud. However, a 3-D point cloud is often required. The other dimension is provided for in a number of ways. Most often, the entire instrument is actuated up and down and/or back and forth, often on a gimbal—a process know within the art as winking or nodding the sensor. Thus, a single beam lidar unit can be employed to capture an entire 3-D array of distance points, albeit one point at a time. An example of this approach is shown in FIG. 3. FIG. 3 shows a 2-D scanner employing a single laser emitter/detector pair and a rotating mirror mounted on a gimbal that "nods" the unit up and down, and rotates it back and forth in order to increase field of view.

In yet other single laser emitter/detector pair mirror-based prior art devices there exists a prism that "divides" the laser pulse into multiple "layers," with each layer having a slightly different vertical angle. This simulates the nodding effect described above but with no need for actuation of the sensor itself.

In all the above examples, the main premise is a single laser emitter/detector combination, where the light path is somehow altered to achieve a broader field of view than a single sensor can achieve. The device is inherently limited to the number of pixels it can generate due to the limitation of how many pulses per second are possible from a single laser. Any alteration of the laser's path, whether it is by mirror, prism, or actuation of the device, causes the point cloud to be less dense, but cover a broader area. The goal for sensors of this nature is to maximize the number of pixels to provide a point cloud that covers a broad field of view yet is as dense as possible.

It is of course possible to add additional lasers and detectors to a rotating mirror unit. While this can easily be done, the resultant performance does not necessarily scale with the number of lasers used. When multiple laser emitter/detector combinations are employed for a spinning mirror scanner, or when the single laser is divided via the use of a prism, the image also rotates. Therefore, while the beams will fan out vertically in one direction, they will twist so as to align horizontally in the 90-degree rotational direction. While this arrangement can be used for forward-looking-only units, it is less than desirable if a sideways view is also desirable, as is often the case for many applications.

There also exist "flash lidar" units. These operate by simultaneously illuminating a large area, and capturing the resultant pixel-distance information on a specialized 2-D focal plane array (FPA). Such sensors are complicated and difficult to manufacture, and as a result not widely deployed commercially. However, it is expected that they will someday replace the mechanically scanned sensors, as they are solid state, and require no moving parts. FIG. 4 shows the framework for the detector array of a flash lidar unit.

It is always desirable to collect more points faster. Until flash lidar technology is perfected, there will always be a compromise of sensors that alter the path of the emitter/detector beam in order to achieve a broader field of view.

As noted above, 3-D point cloud systems exist in several configurations, the needs for autonomous vehicle navigation place unrealistic demands on current systems. For example, there are numerous systems that take excellent pictures, but take several minutes to collect a single image. Such systems are unsuitable for highway use. There are also flash systems that have excellent update rate but lack field of view lack and good distance performance. There are single beam systems that can provide useful information but do not work well with objects that are too small and fall outside the unit's field of view. In reality, it is necessary to see everywhere around the vehicle, almost a full 360 degrees, in order to safely navigate today's highways. In addition, it is necessary to have a minimum of delay between the actions happening in the real world and the imaging/reaction to it. Generally, it is accepted that human response time is in the several tenths of a second. Therefore, it is realistic to provide the navigation computer with a complete fresh update approximately ten times a second. Of course, faster is better, but it may also be possible to navigate successfully with an update rate of 5 times a second. The vertical field of view needs to extend above the horizon, in case the car enters a dip in the road, and should extend down as close as possible to see the ground in front of the vehicle. Of course, it is not possible to see directly in front of the vehicle, since the hood or other parts of the car obstruct the view.

While the preferred embodiment uses 64 discrete vertical beams to capture the point cloud data, as few as 16 beams or fewer could be employed, with largely the same result. In addition, it is preferable to disperse the beams such that there is coverage that is more detailed directly horizontally in front of the vehicle, such concentration being useful for highway driving at speed.

SUMMARY OF THE INVENTION

The present invention provides a lidar-based 3-D point cloud measuring system. An example system includes a base, a housing, a plurality of photon transmitters and photon detectors contained within the housing, a rotary motor that rotates the housing about the base, and a communication component that allows transmission of signals generated by the photon detectors to external components.

In one aspect of the invention, the rotary component includes a rotary power coupling configured to provide power from an external source to the rotary motor, the photon transmitters, and the photon detectors, as well as signal in and out of the unit.

In another aspect of the invention, the photon transmitters and detectors of each pair are held in a fixed relationship with each other.

In another aspect of the invention, a single detector is "shared" among several lasers by focusing several detection regions onto a single detector, or by using a single, large detector.

In another aspect of the invention, a single laser beam is divided into several smaller beams, with each smaller beam focused onto its own detector.

In still another aspect of the invention, the communication component comprises at least one of a rotary coupling device or a wireless communication device.

The present invention provides a more compact and rugged unit for gathering 3-D point cloud information. In addition, the present invention provides the ability to discern multiple returns.

BRIEF DESCRIPTION OF THE DRAWINGS

Preferred and alternative embodiments of the present invention are described in detail below with reference to the following drawings.

DETAILED DESCRIPTION OF THE PREFERRED EMBODIMENT

Figure 1:
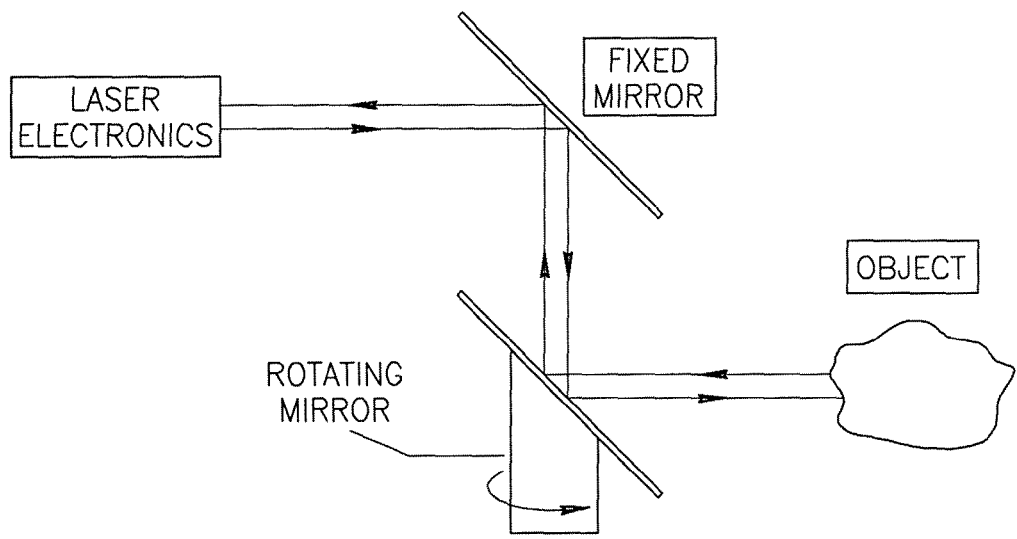
FIGS. 1-4 illustrate inventions formed according to the prior art.
Figure 2:
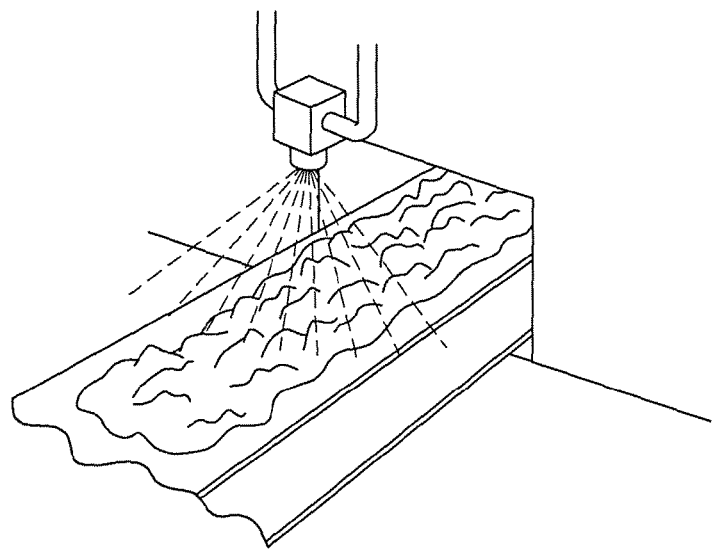
Figure 3:
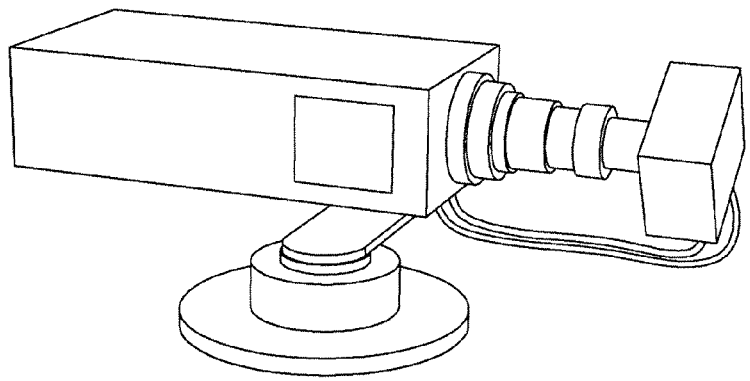
Figure 4:
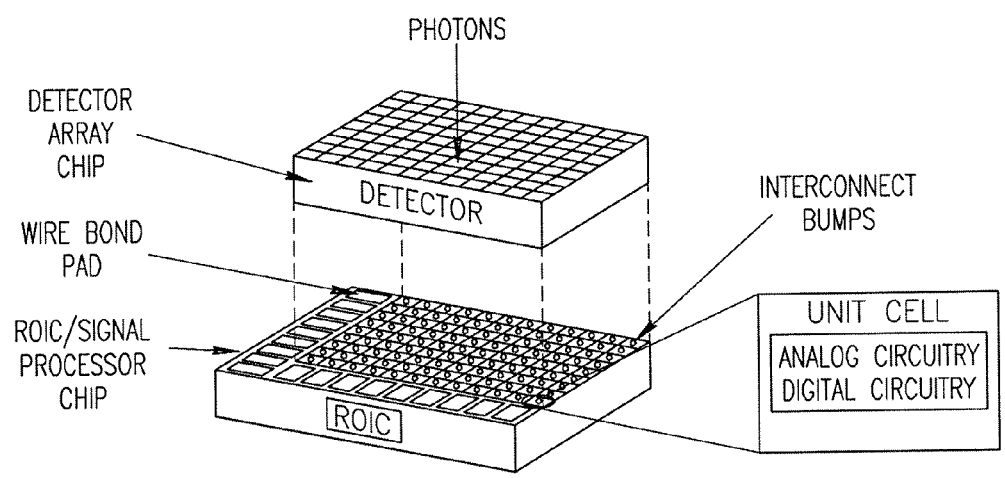
Figure 5:
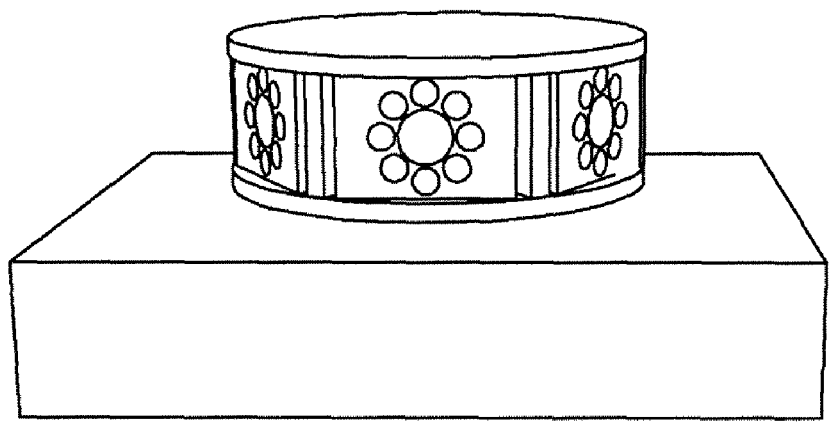
FIG. 5 is a Lidar Terrain mapping and obstacle detection system shown at rest.
Figure 6:
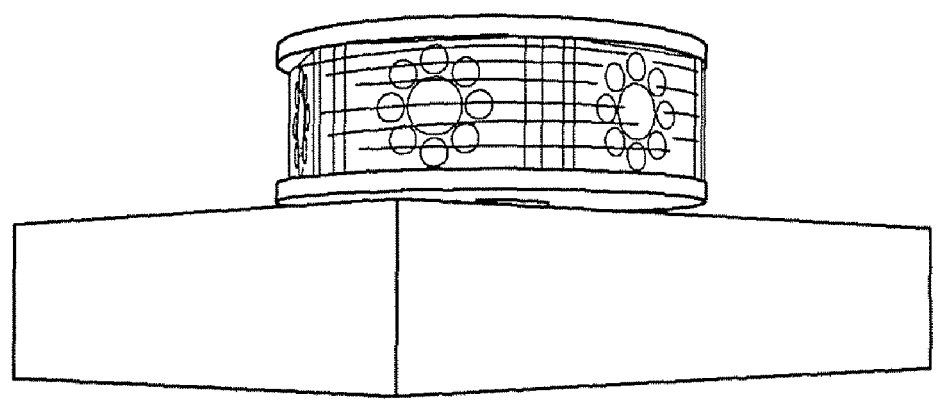
FIG. 6 is the Lidar Terrain mapping and obstacle detection system shown in operation at 300 RPM.
Figure 7:
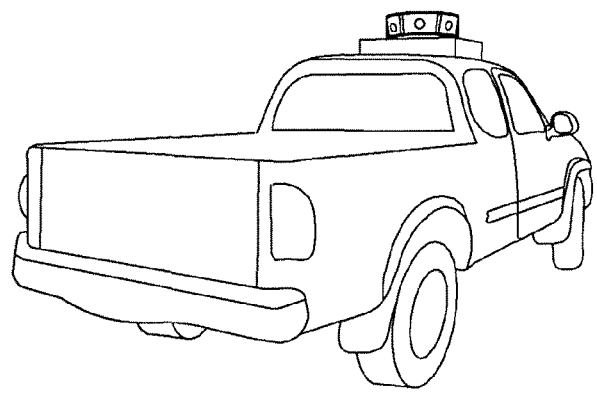
FIG. 7 is a perspective view of the present invention mounted to a vehicle.
Figure 8A:
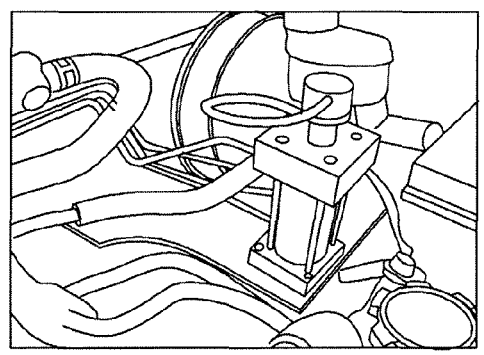
FIGS. 8A and B illustrate components of an auto braking and auto steering components.
Figure 8B:
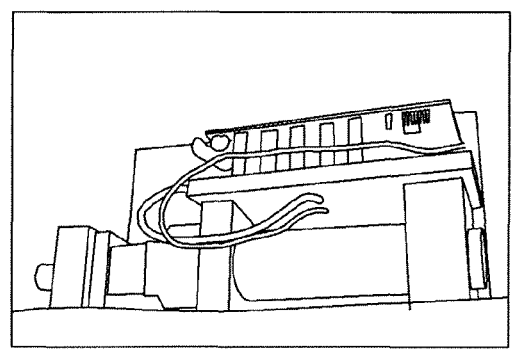

FIGS. 5-12 illustrate a Laser Imaging Detection and Ranging (Lidar) terrain mapping and obstacle detection system employed as a sensor for an autonomous vehicle. The Lidar system includes 8 assemblies of 8 lasers each as shown in FIG. 5 or 2 assemblies of 32 lasers each forming a 64-element Lidar system as shown in FIGS. 13-26. The system has a 360-degree horizontal field of view (FOV) and a 26.8-degree vertical FOV. The system is typically mounted on the top center of a vehicle, giving it a clear view in all directions, and rotates at a rate of up to 200 Hz, thereby providing a high point cloud refresh rate, such high rate being necessary for autonomous navigation at higher speeds. At this configuration, the system can collect approximately 1 million time of flight (TOF) distance points per second. The system provides the unique combination of 360 degree FOV, high point cloud density, and high refresh rate. The standard deviation of TOF measurements is equal to or less than 5 cm. The Lidar system has an inertial navigation system (INS) sensor system mounted on it to report exact pitch and roll of the unit that is used by navigational computers to correct for these deviations. The unit generates its own light and uses a proprietary filter to reject sunlight, so it works well under all lighting and most weather conditions. Through the use of digital signal processor (DSP) control, a dynamic power feature allows the system to increase the intensity of the laser emitters if a clear terrain reflection is not obtained by photo detectors (whether due to reflective surface, weather, or other reasons), and to reduce power to the laser emitters for safety reasons if a strong reflection signal is detected by photo detectors. A direct benefit of this feature is that the Lidar system is capable of seeing through fog and heavy rain by increasing laser power dynamically and ignoring early reflections. The unit also has the capability to receive and decipher multiple returns from a single laser emission through digitization and analysis of the waveform generated by the detector as the signal generated from the emitter returns.

The Lidar system sends data in the form of range and intensity information via Ethernet output (or similar output) to a master navigational system. Using standard trigonometry, the range data is converted into x and y coordinates and a height value. The height value is corrected for the vehicle's pitch and roll so the resulting map is with reference to the horizontal plane of the vehicle. The map is then "moved" in concert with the vehicle's forward or turning motion. Thus, the sensor's input is cumulative and forms an ultra-high-density profile map of the surrounding environment.

This highly detailed terrain map is then used to calculate obstacle avoidance vectors if required and, as importantly, determine the maximum allowable speed given the terrain ahead. The Lidar system identifies of size and distance of objects in view, including the vertical position and contour of a road surface. The anticipated offset of the vehicle from a straight, level path, either vertical or horizontal, at different distances is translated into the G-force that the vehicle will be subject to when following the proposed path at the current speed. That information can be used to determine the maximum speed that the vehicle should be traveling, and acceleration or braking commands are issued accordingly. In all cases the software seeks the best available road surface (and thus the best possible speed) still within the boundaries of a global positioning system (GPS) waypoint being traversed.

The system shown in FIGS. 5-8 includes 64 emitter/detector (i.e. laser diode/photo diode) pairs divided into eight groups of eight. The system shown in FIGS. 13-24 also includes 64 emitter/detector pairs, but in a configuration of 2 assemblies of 32 pairs. It is also possible to "share" a single detector among several lasers by focusing several detection regions onto a single detector, or by using a single, large detector. By firing a single laser at a time, there would be no ambiguity as to which laser is responsible for a return signal.

Conversely, one could also sub-divide a single laser beam into several smaller beams. Each beam would be focused onto its own detector. In any event, such systems are still considered emitter-detector pairs.

The laser diode is preferably an OSRAM 905 nm emitter, and the photo diode is preferably an Avalanche variety, but other types can be used. The lenses are preferably UV treated to block sunlight. Each pair is physically aligned in ⅓° increments, ranging from above horizontal (aligned at 500 feet in front of the vehicle) to approximately −24° (aligned to 20 feet in front of the vehicle). Each of the emitter/detector pairs are controlled by one or more DSPs, which determines when they will fire, determines the intensity of the firing based on the previous return, records the time-of-flight, calculates height data based time-of-flight and angular alignment of each pair. Results, including multiple returns if any, are transmitted via Ethernet to the master navigational computer via a rotary coupling.

It is advantageous to fire only several lasers, or preferably just one, at a time. This is because of naturally occurring crosstalk, or system blinding that occurs when the laser beam encounters a retroreflector. Such retroreflectors are commonly used along the roadways. A single beam at a time system is thus resistant to retroreflector blinding, while a flash system could suffer severe image degradation as a result.

Another advantage of firing only a small number of lasers at a time is the ability to share, or multiplex, the detection circuitry among several detectors. Since the detection circuitry consists of high speed A-D's, such as those made by National Semiconductor, considerable cost savings can be had by minimizing the use of these expensive components.

In the preferred embodiment, the detectors are power cycled, such that only the desired detector is powered up at any one time. Then the signals can simply be diode-ored together to obtain the desired multiplexing. An additional benefit of power-cycling the detectors is that total system power consumption is reduced, and the detectors therefore run cooler and are therefore more sensitive.

A simple DC motor controller driving a high reliability brushed motor controls the rotation of the emitter/detectors. A rotary encoder feeds rotational position to the DSPs that use the position data to determine firing sequence. Software and physical failsafes ensure that no firing takes place until the system is rotating at a minimum RPM.

In one embodiment, the navigational system uses Dual GPS receivers. The first is a Navcom 2050G using the Starfire subscription service and the second is a Novatel ProPak-LB receiver using the Omnistar subscription service. These subscription services typically deliver 2-inch accuracy under full sky-in-view conditions when operating in dual-differential mode. Any high precision GPS system could be used. The GPS receivers are used to correct the errors in the INS. The INS includes gyros, such as fiber optic gyros (FOG). In addition, there is a 6-axis inertial system mounted on the Lidar head that is used to correct the Lidar signal as well as provide pitch and roll information for correcting the FOG gyro signal.

Vehicle control is accomplished through the actuation of 2 20 HP brushless motors for brake and steering respectively (see FIGS. 8A, B), controlled by Texas Instruments C2400 DSP chips. The acceleration is accomplished electronically by tying into the dual voltage acceleration system of the vehicle. The present invention can be retrofitted on virtually any vehicle—land, air, sea, or space vehicles.

Figure 9A:
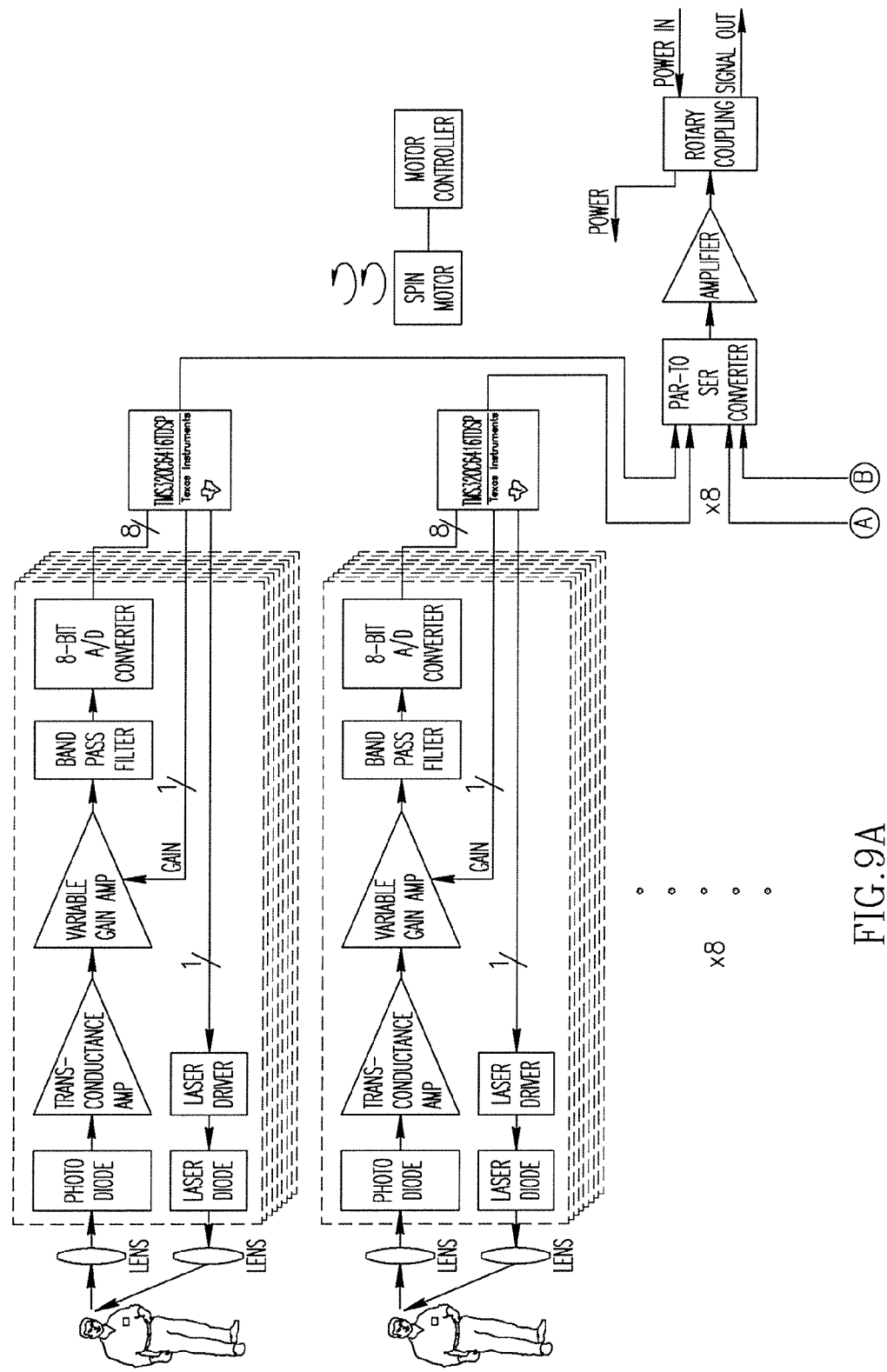
FIGS. 9 and 10 illustrate circuits for performing data acquisition and auto vehicle control.
Figure 9B:
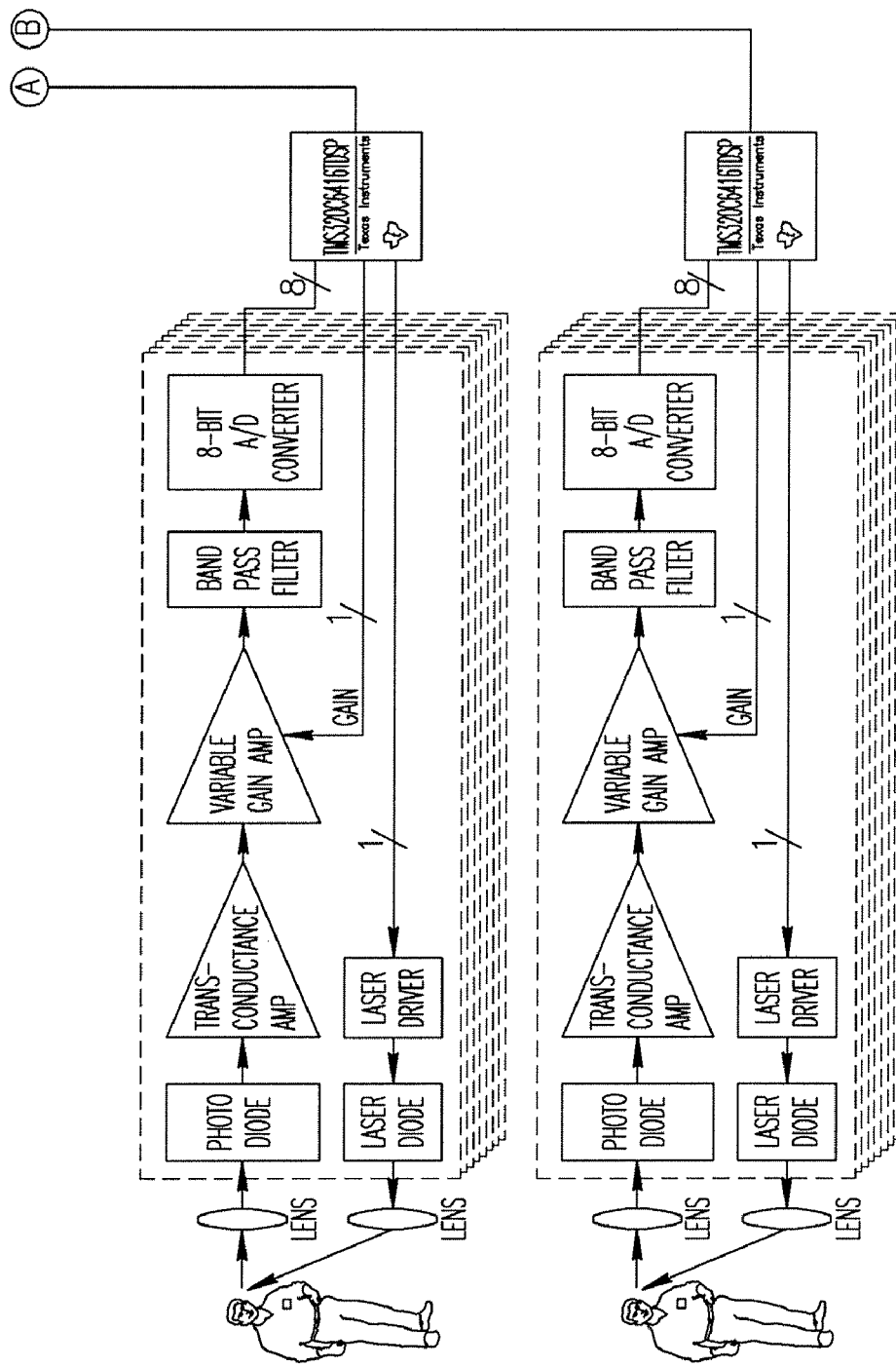

FIG. 9 illustrates an example of the circuit components within a rotating head unit. The rotating head unit includes multiple detector and emitter circuits each having its own processor. The data produced by each circuit is output to external components via a rotary coupling. Other data transmission techniques may be used, such as wireless transmission via any of a number of different wireless protocols.

Figure 10:
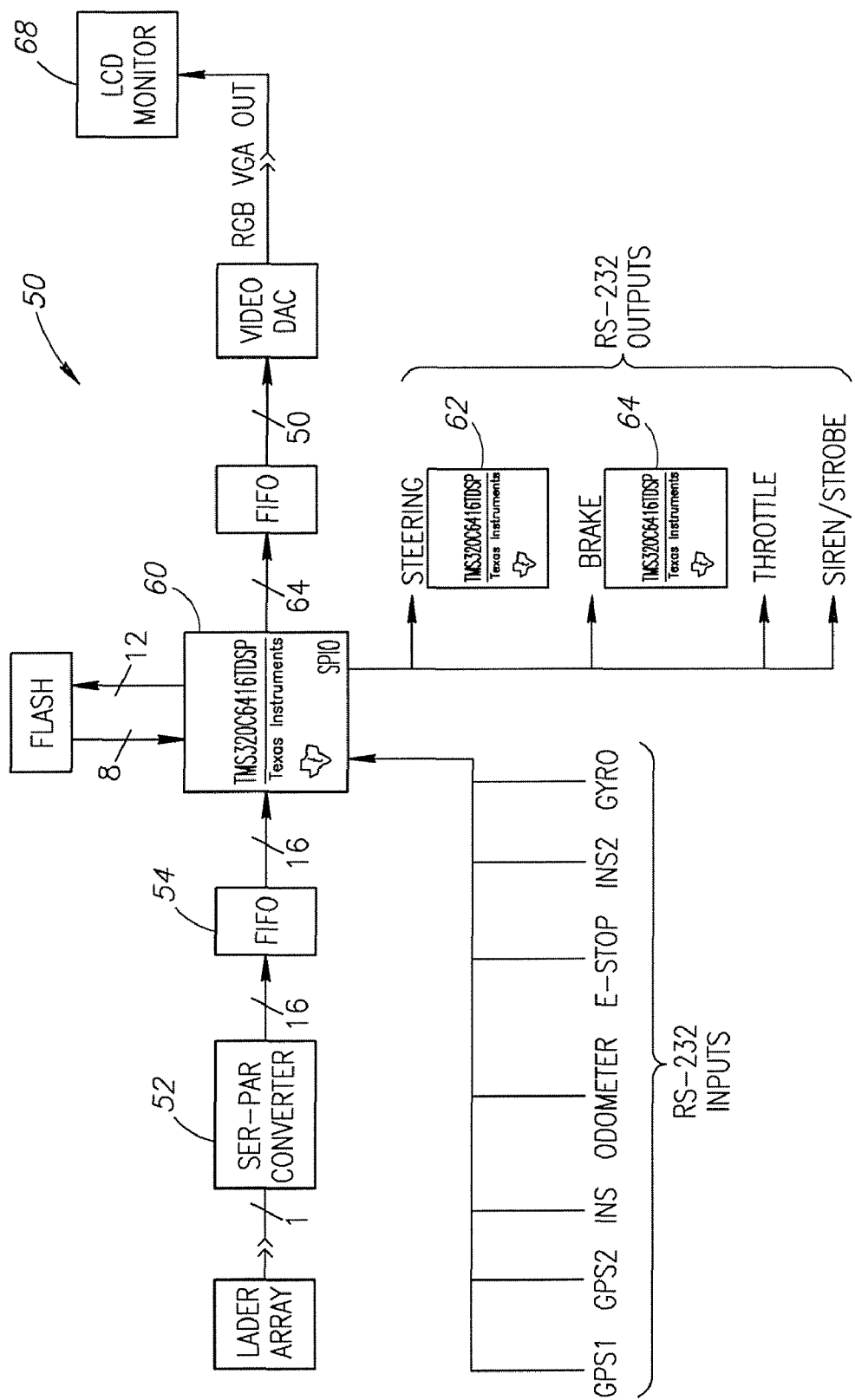
Figure 11:
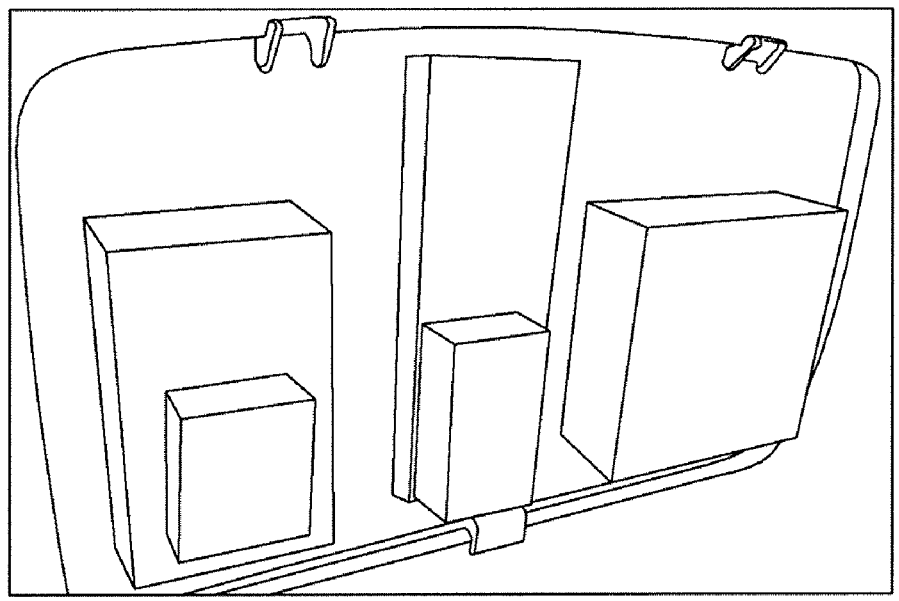
FIGS. 11 and 12 illustrate components of an auto vehicle operating system.
Figure 12:
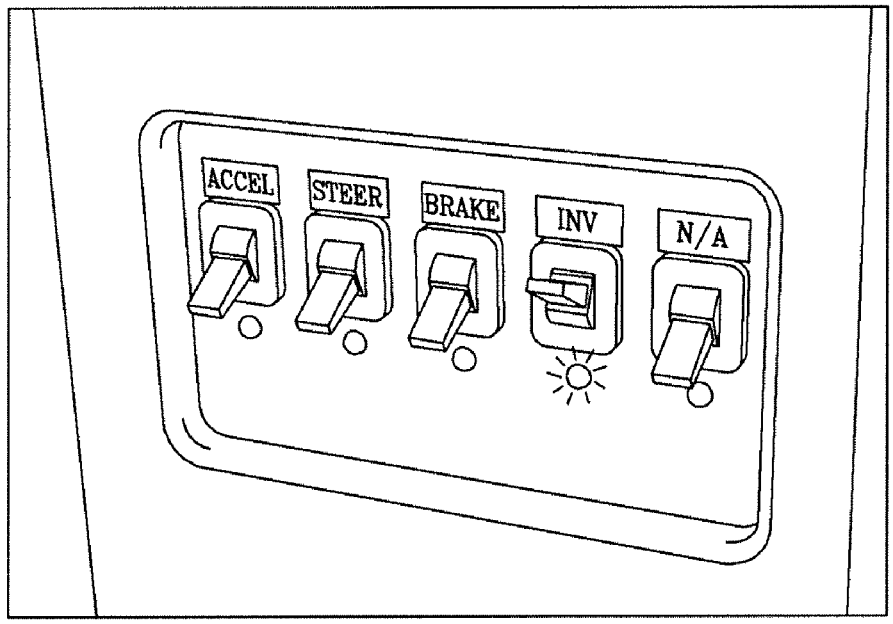

FIG. 10 shows the key navigational aspects of a system 50 and how they interconnect. The terrain map as generated from the Lidar terrain-mapping system (not shown) is fed via a single channel high-speed connection to a serial-to-parallel converter 52, which then populates a FIFO memory array 54 (later embodiments transfer information via an ETHERNET connection). A DSP 60 then receives the Lidar information from the FIFO array 54 along with information from two GPSs, two INSs, FOG Gyro, Odometer, and remote kill switch. This data is evaluated to decide the vehicle's path followed by serial commands issued to control the vehicle (note the steering, brake, throttle, and siren outputs). The steering and brake motors are controlled by DSPs 62, 64, and the acceleration is controlled through an electronic interface via a custom interface board. The DSP 60 also controls a video display 68 that allows viewing of the Lidar image for observation and debugging purposes.

A small footprint is achieved through the use of embedded DSP technology. All PC boards for decision making, sensing, motor control and navigational data are proprietary, designed exclusively for this purpose, and fit in a single motherboard/daughterboard case. All major navigational components fit in a box mounted on the roof of the truck cab (shown in FIGS. 7 and 11). The only other modifications to the vehicle are a steering motor integrated with the steering mechanism in the engine compartment, a brake motor that sits on the floor of the cab, and the acceleration interface (in this case electronic).

The result of the preferred embodiment design is a truck that is street legal and that affords full passenger comforts even while in autonomous mode. The entirety of system testing is performed while riding inside the vehicle and actuating three switches for gas, steering and brake over the driver's head, shown in FIG. 12.

The present invention performs at a frame rate that permits high-speed navigation, provides recognition of both positive and negative obstacles, provides exceptional point cloud density, provides full 360 degree HFOV, provides broad VFOV, and provides high accuracy rates.

Figure 13:
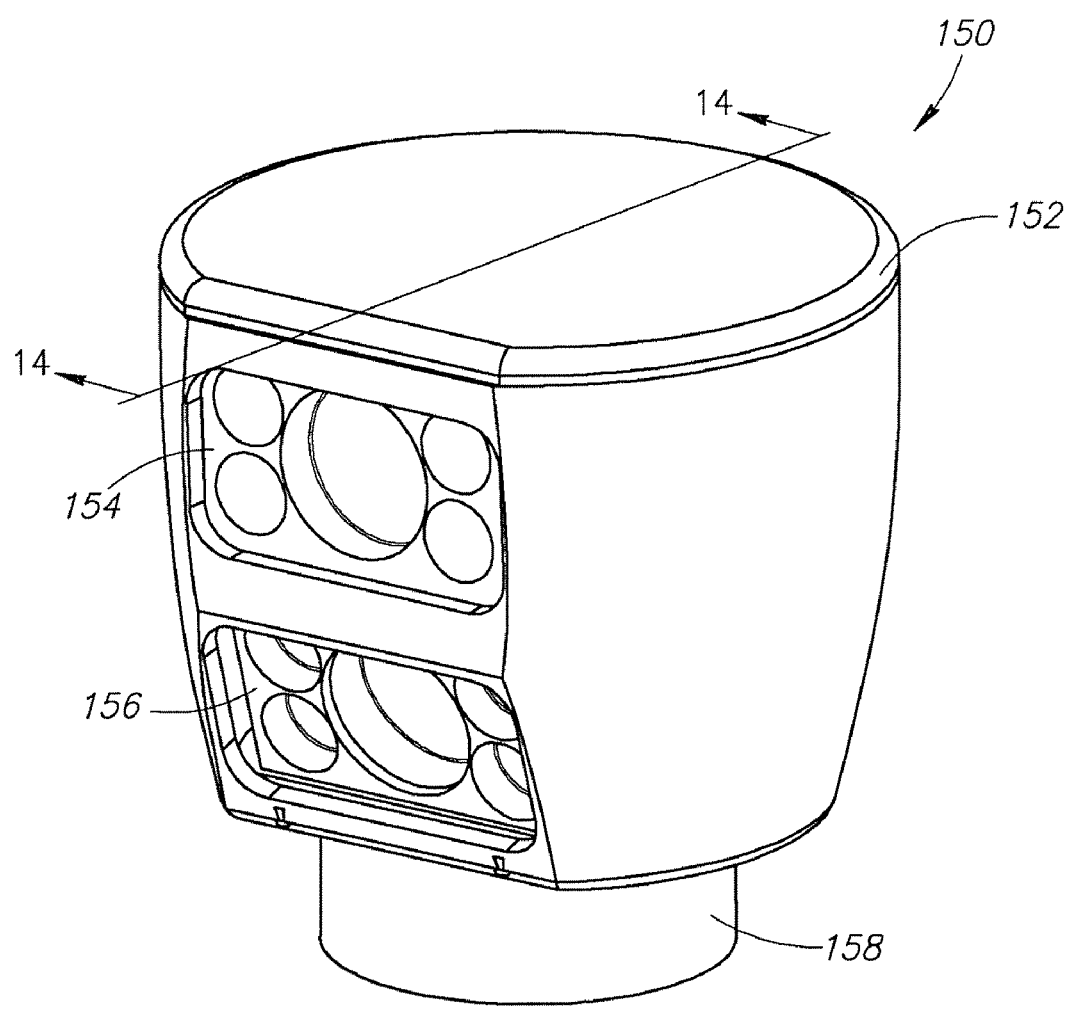
FIGS. 13-22 illustrate various views of a scanning device formed in accordance with an embodiment of the present invention.

FIG. 13 illustrates a perspective view of a 64 emitter/detector pair lidar component 150. The component 150 includes a housing 152 that is opened on one side for receiving a first Lidar system 154 located above a second Lidar system 156. The second Lidar system 156 is positioned to have line of sight with a greater angle relative to horizontal than the first Lidar system 154. The housing 152 is mounted over a base housing section 158.

Figure 14:
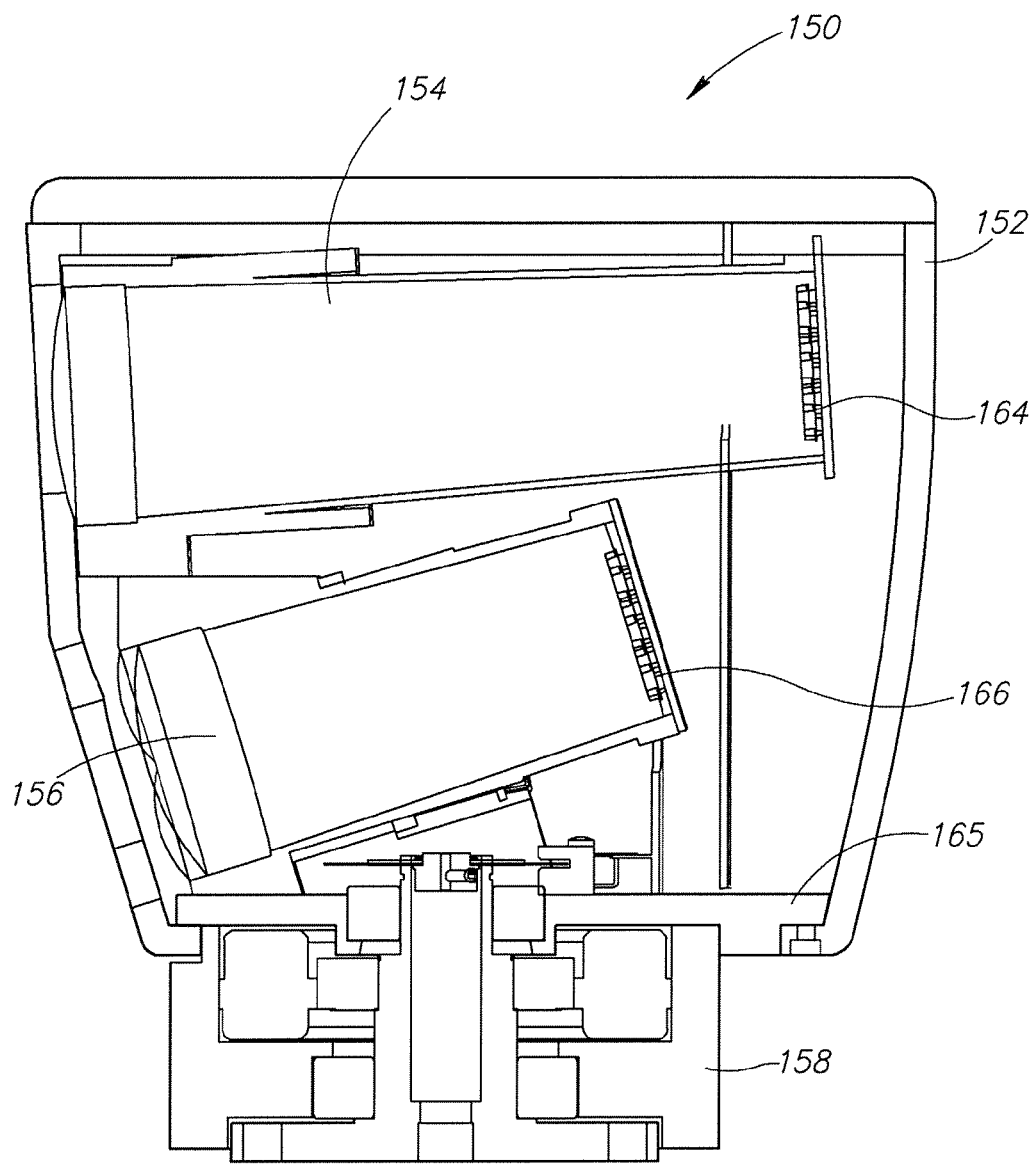
Figure 15:
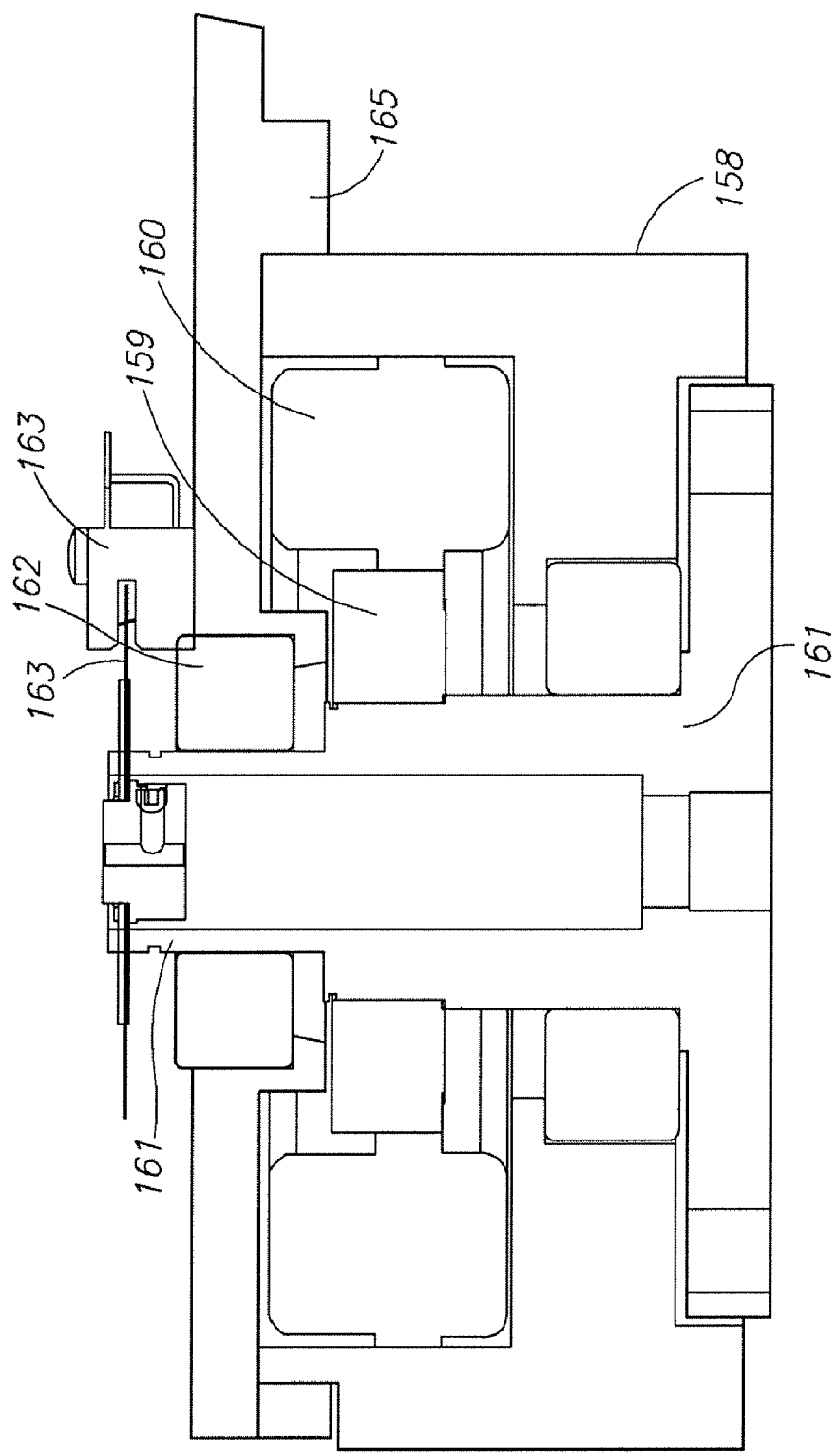

As shown in FIGS. 14 and 15, the section 158 includes a magnetic rotor 159 and stator 160. A rotary coupling 161, such as a three-conductor Mercotac model 305, passes through the center of the section 158 and the rotor 159. The three conductors facilitated by the rotary coupling are power, signal, and ground. A bearing 162 mounts on the rotary coupling 161. A rotary encoder 163 has one part mounted on the rotary coupling 161 and another part mounted on the base section 158 of the housing 152. The rotary encoder 163, such as a U.S. Digital Model number E6s-1000-750-T-PKG1 provides information regarding to rotary position of the housing 152. The magnetic rotor 159 and stator 160 cause rotary motion of the base section 158 and thus the housing 152 about the rotary coupling 161.

Figure 16:
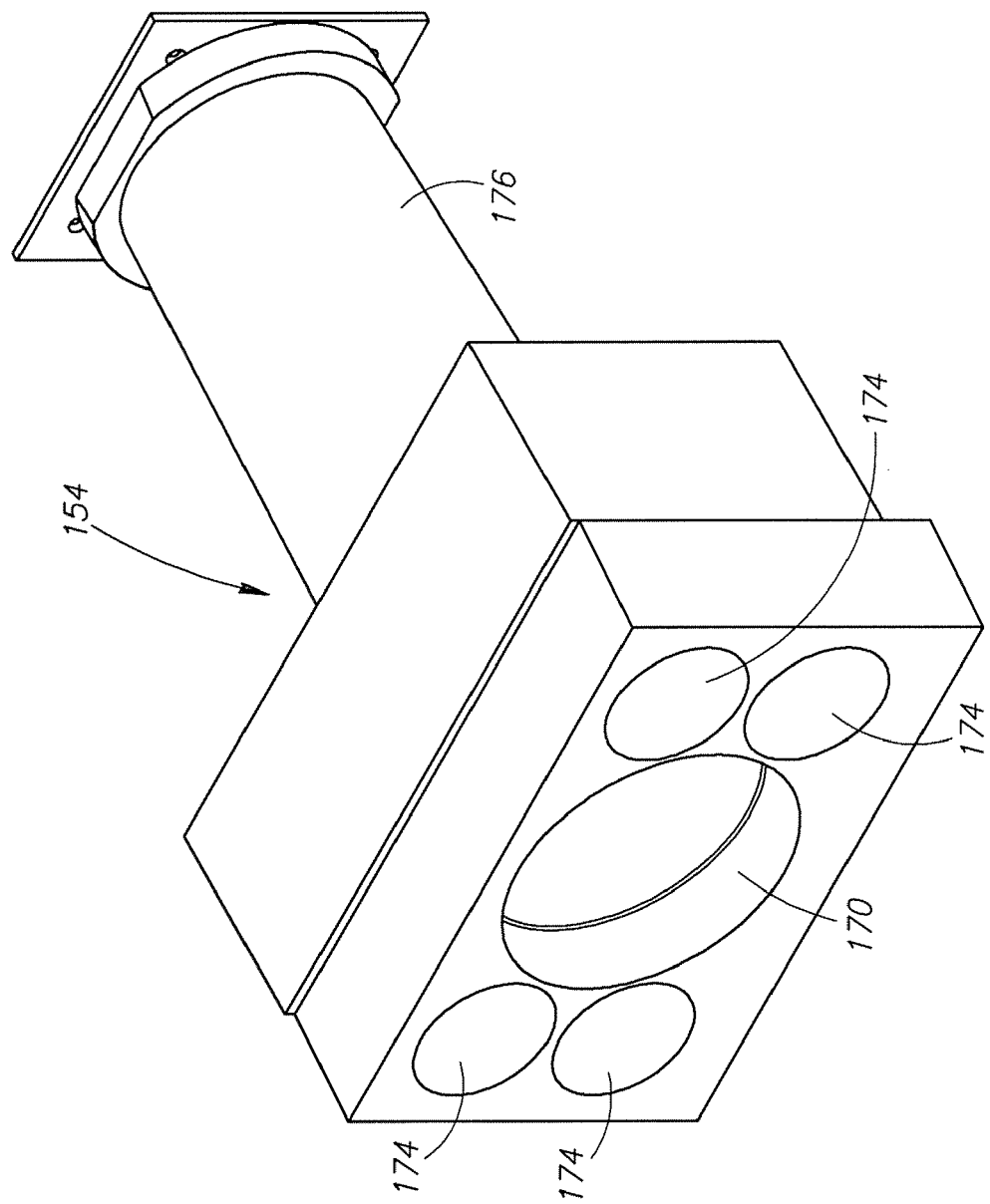
Figure 17:
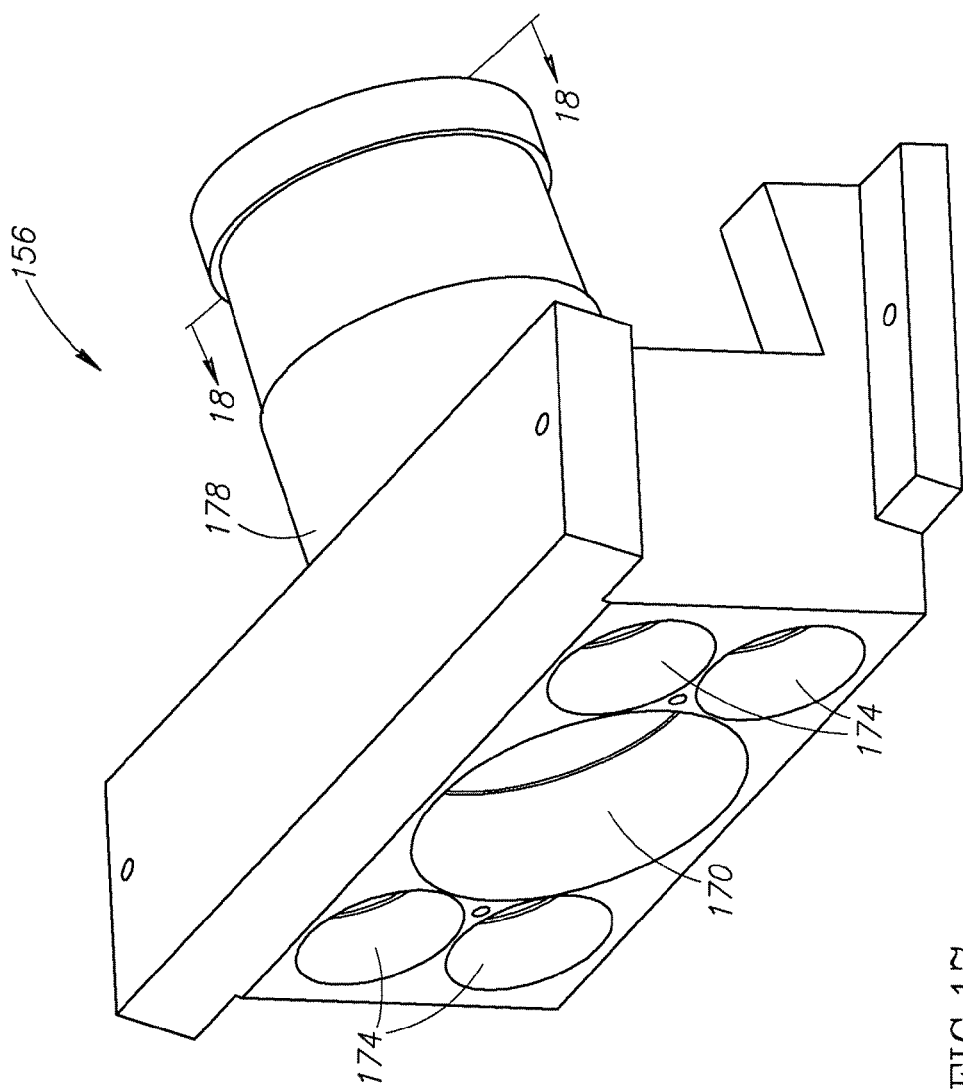
Figure 18:
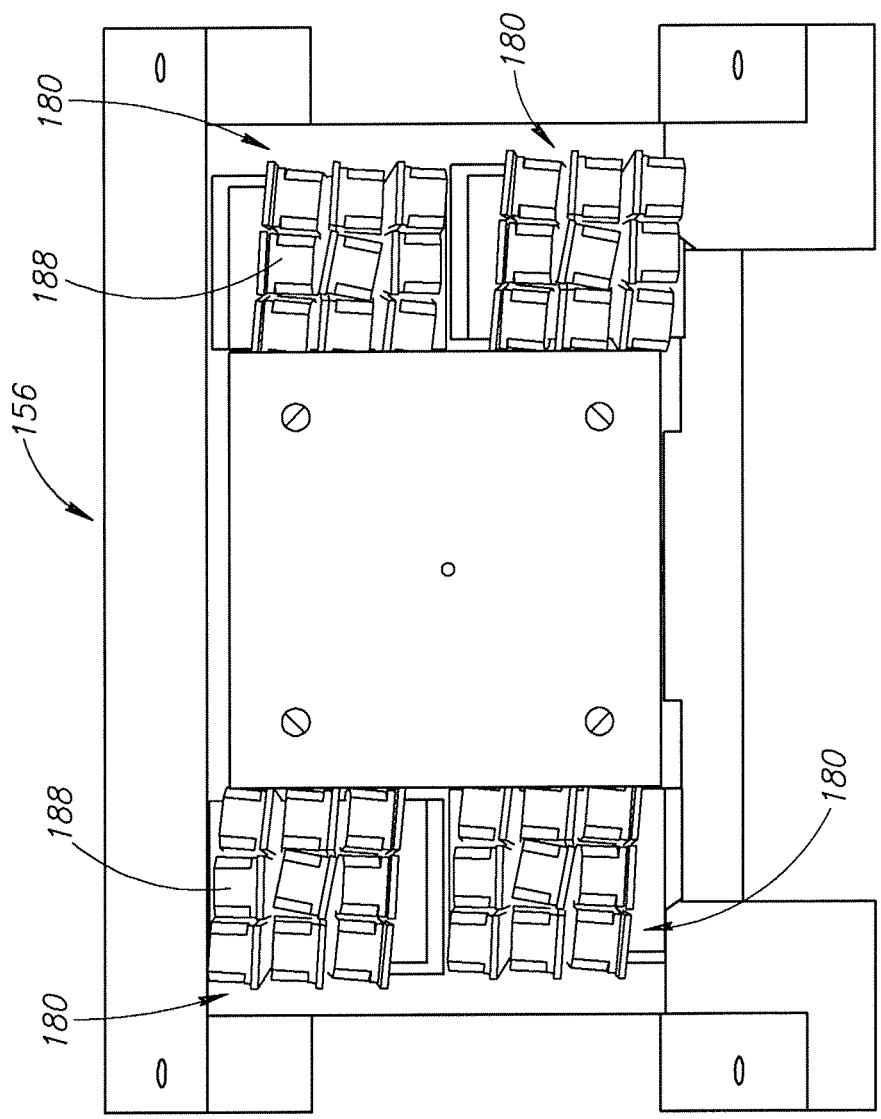
Figure 19:
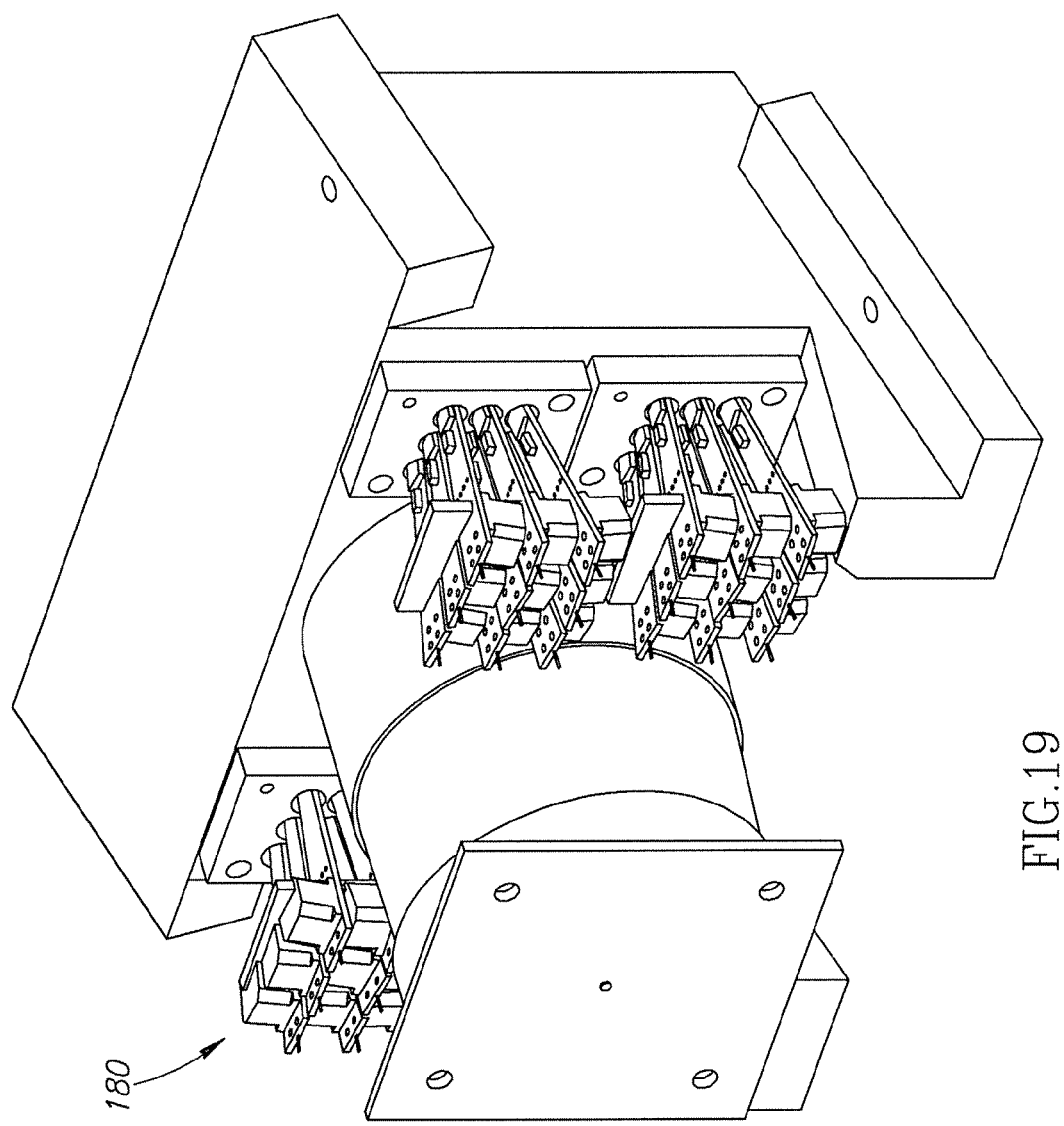
Figure 20:
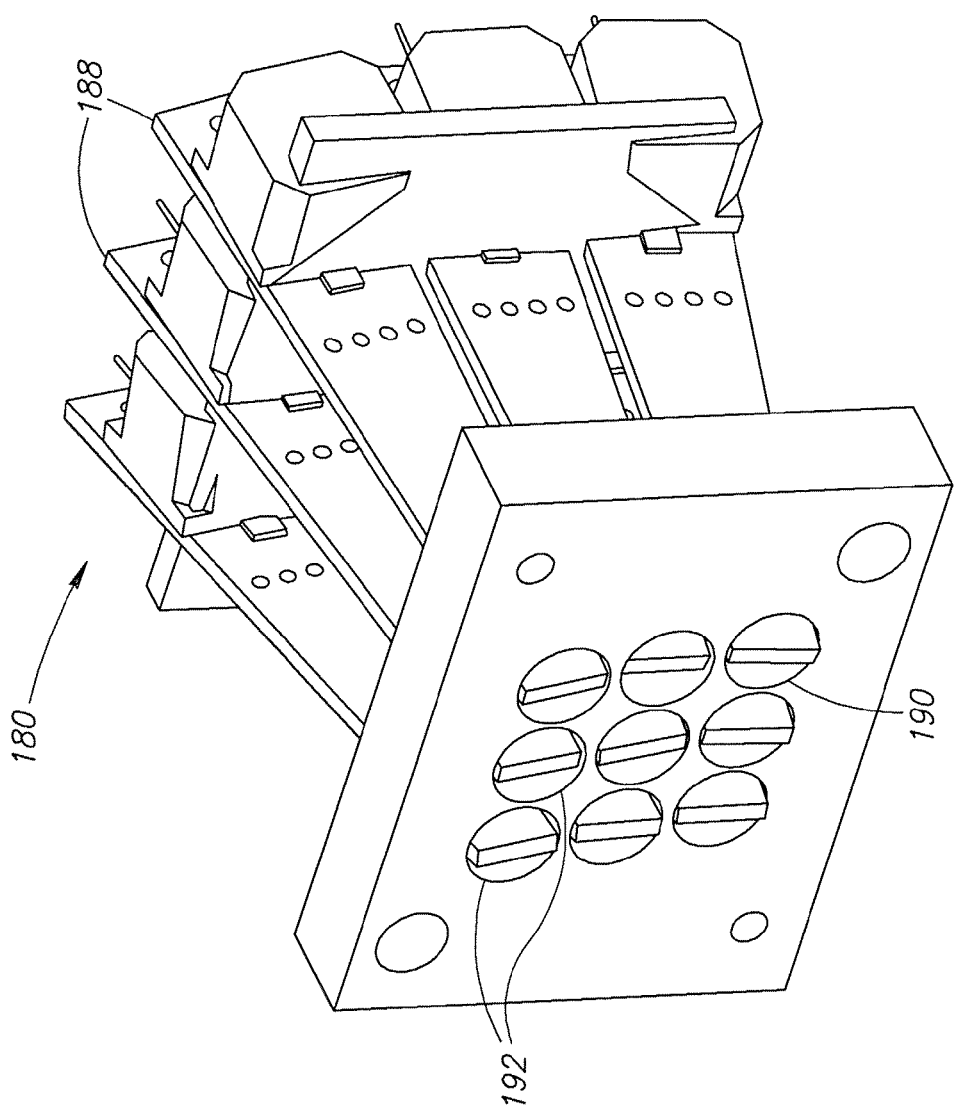
Figure 21:
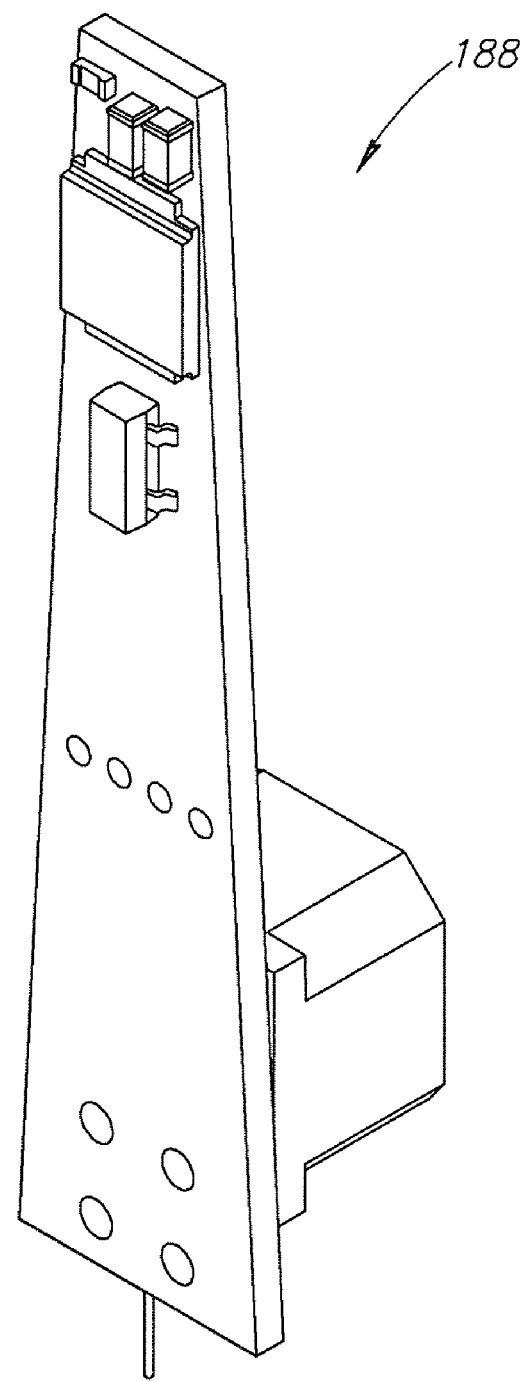
Figure 22:
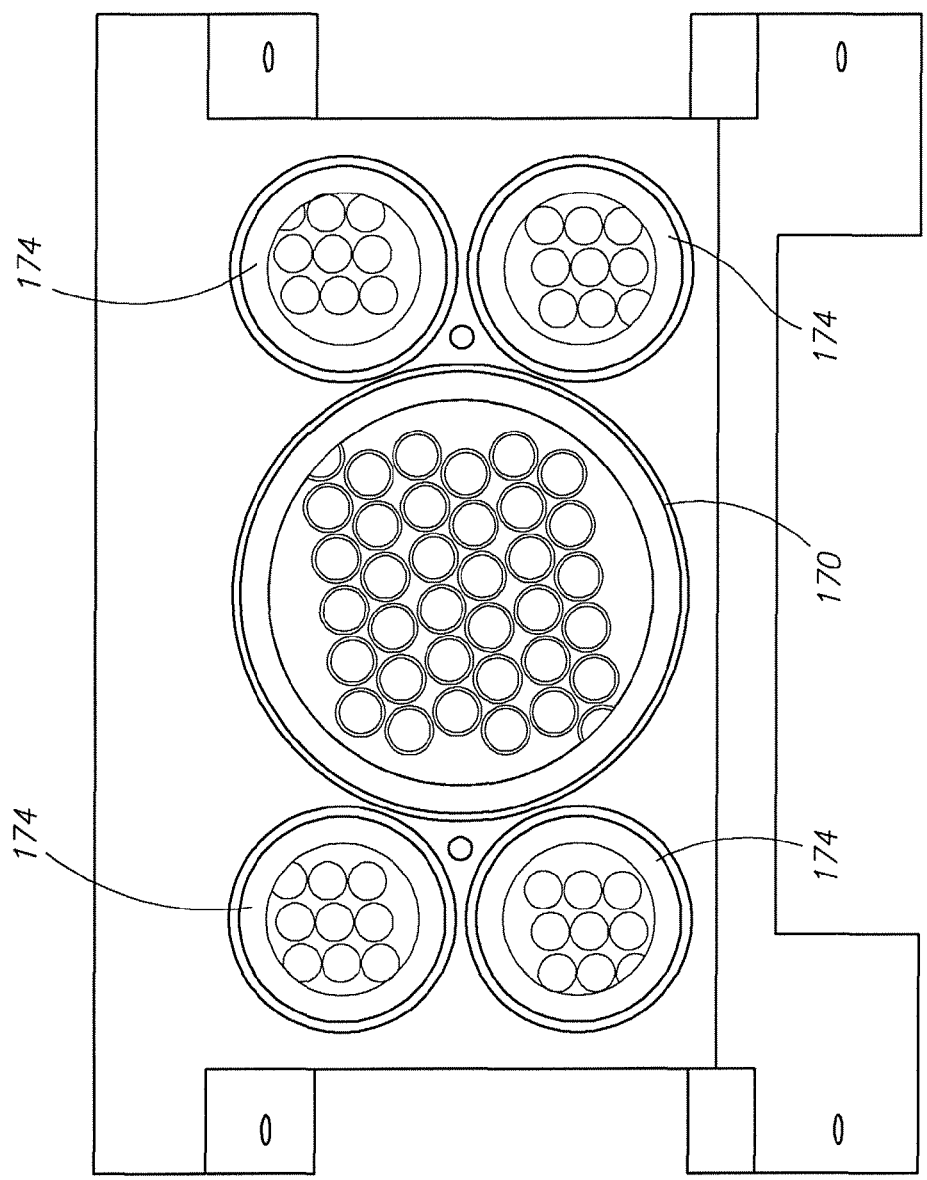

FIG. 16 illustrates a perspective view of the first Lidar system 14. The Lidar system 154 includes a face section that has two cavities 174 for mounting emitter lenses and one larger cavity 170 for mounting the single detector lens. As shown in FIG. 22, behind each of the lenses in the cavity 174, are 16 laser emitters organized relatively horizontally, thereby combining for 32 total emitters. Behind the lens of the cavity 170 are 32 detectors that are positioned within a tube 176 of the unit 154. As shown in FIG. 17 the second lidar unit 156 is somewhat comparable to the first Lidar system 154, but includes a shorter tube 178 and has a downward looking pitch angle. FIG. 18 illustrates a rearview of the second Lidar system 156.

Behind each of the lenses of the cavity 174, are emitter packages 180. Each emitter package 180 includes 16 distinct emitters 188 (per side). Each emitter 188 of an emitter unit 180 is positioned within unit 196 and of laser bracket 195 (see FIGS. 19 and 20). Each emitter is aligned to the corresponding receiver on the laser detector board 166 than attached with adhesive to each emitter and to bracket laser unit 196 and bracket block strap 195.

Figure 23A:
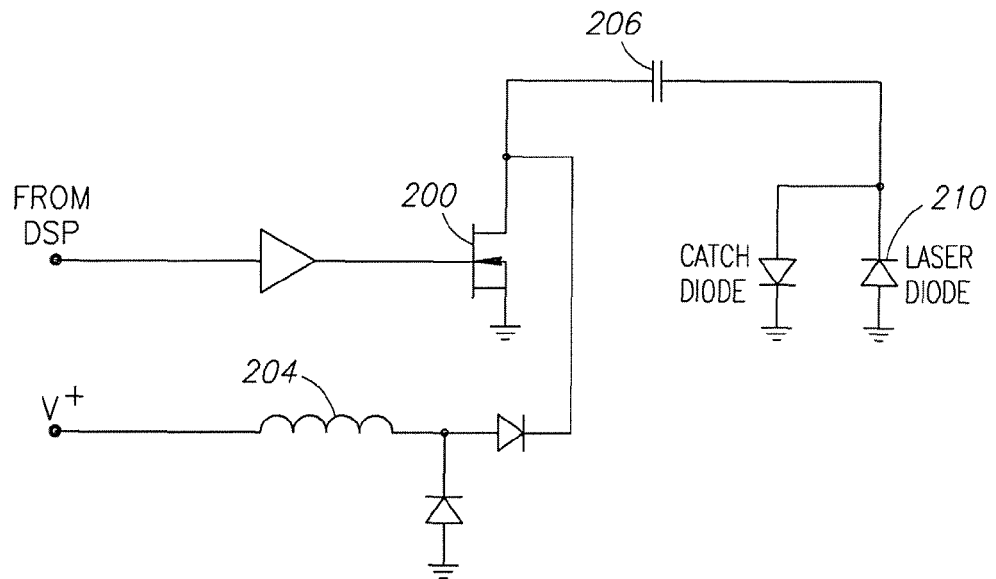
FIGS. 23A and B illustrate various circuits for driving laser diodes.

FIGS. 23A and B illustrate circuits used for controlling the firing of a laser diode. With regard to FIGS. 23A and 24, the DSP sends a charge/on signal to a FET 200, thereby charging an inductor 204, which in turn charges a capacitor 206, which in turn causes a laser 210 to fire. The DSP turns off the FET 200 after a predetermined period of time as previously determined by return intensity measurements from the last pulse. The charging pulse is on for ~5 microseconds and the firing pulse is on for ~20 nanoseconds. variable power laser diode firing circuit. It can be seen that the energy stored in the inductor is $\frac{1}{2}*L*I^2$. When the FET is turned off, this energy is transferred into the discharge capacitor via a diode. The energy in the capacitor is $\frac{1}{2}° C.*V^2$. It is apparent then that the voltage that is in the capacitor is proportional to the on duration of the FET. Therefore, the DSP can use a simple algorithm to predict the proper amount of voltage in the capacitor. For example, if the return pulse is ½ as large as desirable, from a noise and measurement accuracy point of view, then the DSP simply charges the inductor for twice as long for the next pulse. Of course, such a system cannot see into the future, so it is not always possible to get the perfect return intensity every time. Nevertheless, the technique works well enough most of the time for the system to benefit from the technique.

Figure 23B:
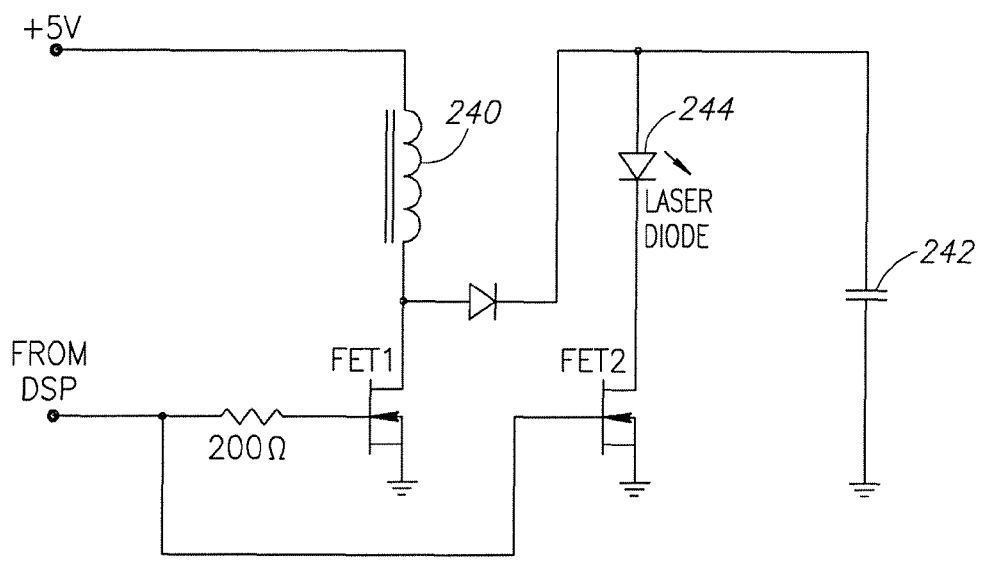
Figure 24:
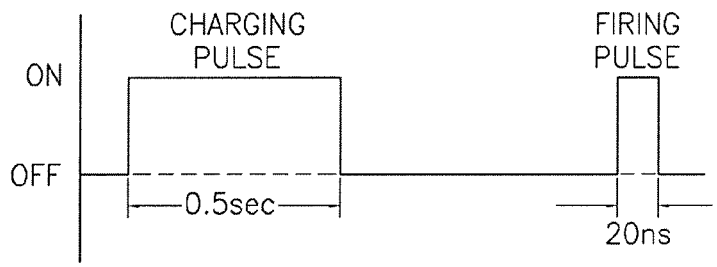
FIG. 24 illustrates example pulses generated for the laser diode.

FIG. 23B includes two FETs. When FET1 is on during a charging pulse (FIG. 24), an inductor 240 charges a capacitor 242. When the FET2 is on during the firing pulse (see FIG. 24), FET2 causes the capacitor 242 to discharge thereby firing a laser diode 244.

Figure 25:
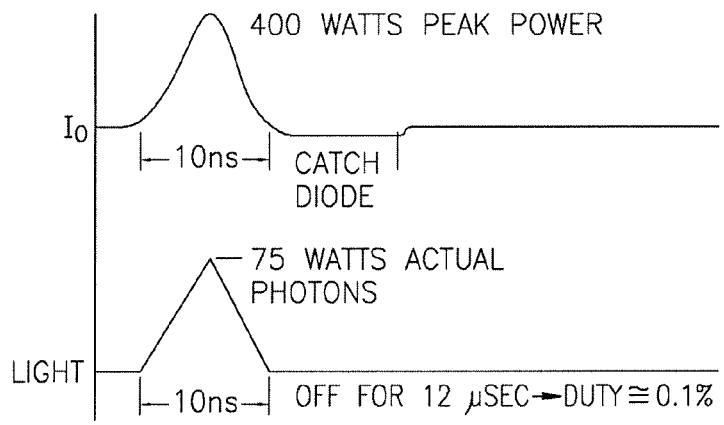
FIGS. 25-26 illustrate results of operation of the circuit from FIG. 23A.
Figure 26:
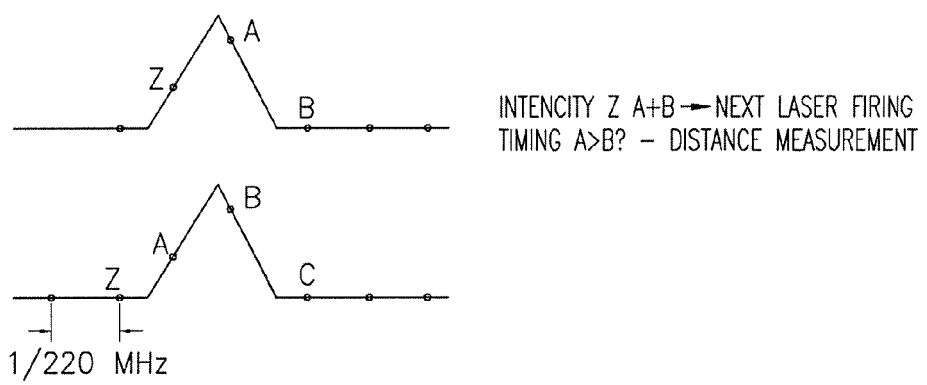

FIG. 25 illustrates current and luminance output of the circuits of FIGS. 23A and B. FIG. 26 shows digitized sensed values at the photo diode of the receiving side.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A lidar-based 3-D point cloud system comprising:
a support structure;
a plurality of laser emitters supported by the support structure;
a plurality of avalanche photodiode detectors supported by the support structure; and
a rotary component configured to rotate the plurality of laser emitters and the plurality of avalanche photodiode detectors at a speed of at least 200 RPM.

2. The system of claim 1, further comprising a rotary power coupling configured to provide power from an external source to the plurality of laser emitters and the plurality of avalanche photodiode detectors.

3. The system of claim 1, wherein each one of the plurality of laser emitters is paired with a separate one of the plurality of photon detectors in a fixed position to form a plurality of pairs of laser emitters and avalanche photodiode detectors.

4. The system of claim 3, wherein each one of the plurality of pairs of laser emitters and avalanche photodiode detectors is aligned in a direction that is angularly separated from each other one of the pairs of laser emitters and avalanche photodiode detectors.

5. The system of claim 4, wherein the angular separation between each one of the plurality of pairs of laser emitters and avalanche photodiode detectors is ⅓°.

6. The system of claim 3, wherein the support structure is mountable to a vehicle, and further wherein each one of the plurality of pairs of laser emitters and avalanche photodiode detectors is aligned in a direction that is angularly separated from each other one of the pairs of laser emitters and avalanche photodiode detectors, the plurality of pairs of laser emitters and avalanche photodiode detectors being aligned to locations between 20 feet and 500 feet from the vehicle.

7. The system of claim 1, wherein the rotary power coupling is further configured to transmit signals to and from the plurality of laser emitters and the plurality of avalanche photodiode detectors.

8. The system of claim 1, wherein the rotary component is configured to rotate the support structure through a full 360 degree rotation at the rotation speed of at least 200 RPM.

9. The system of claim 1, further comprising a communication component configured to allow transmission of signals generated by the avalanche photodiode detectors to an external component.

10. The system of claim 1, wherein the support structure further comprises a housing and a base, the plurality of laser emitters and the plurality of avalanche photodiode detectors being secured within the housing, the rotary component further being configured to rotate the housing about the base.

11. The system of claim 10, further comprising a rotary encoder configured to determine rotational location of the housing relative to the base.

12. The system of claim 1, wherein the plurality of laser emitters comprises sixteen laser emitters and the plurality of avalanche photodiode detectors comprises at least sixteen avalanche photodiode detectors.

13. The system of claim 1, wherein at least one of the avalanche photodiode detectors is configured to receive reflections from more than one laser emitter.

14. The system of claim 1, wherein the plurality of laser emitters is configured to pulse at a rate of more than about 1 million pulses per second.

15. The system of claim 1, wherein the support structure is mounted to a vehicle.

16. The system of claim 1, further comprising a processor in signal communication with the plurality of avalanche photodiode detectors and the plurality of laser emitters, the processor being configured to cause the laser emitters to emit pulses of a reduced power level when at least one of the avalanche photodiode detectors detects a return signal above a threshold level.

17. The system of claim 1, further comprising a processor in signal communication with the plurality of laser emitters, the processor being configured to prevent the laser emitters from firing when the rotary component is not rotating.

18. The system of claim 1, further comprising a processor in signal communication with the plurality of laser emitters, the processor being configured to prevent the laser emitters from firing when the rotary component is rotating below a threshold level.

19. A method of generating a 3-D point cloud comprising:
providing a lidar system having:
a support structure, a plurality of laser emitters supported by the support structure;
a plurality of avalanche photodiode detectors supported by the support structure, and a rotary component configured to rotate the plurality of laser emitters and the plurality of avalanche photodiode detectors at a speed of at least 200 RPM;
rotating the plurality of laser emitters and the plurality of avalanche photodiode detectors at a speed of at least 200 RPM; and
emitting light from the plurality of laser emitters.

20. The method of claim 19, further comprising mounting the support structure to a vehicle, and further wherein each one of the laser emitters is aligned in a direction that is angularly separated from each other one of the laser emitters, the laser emitters being aligned to locations substantially evenly spaced between 20 feet and 500 feet from the vehicle.

21. The method of claim 19, wherein the support structure further comprises a housing and a base, the method further comprising determining a rotational location of the housing relative to the base.

22. The method of claim 19, wherein the step of emitting light further comprises pulsing the laser emitters at a rate of more than about 1 million pulses per second.

23. The method of claim 19, wherein the lidar system further comprises a processor in signal communication with the plurality of avalanche photodiode detectors and the plurality of laser emitters, the processor being configured to cause the laser emitters to emit pulses of a reduced power level when at least one of the avalanche photodiode detectors detects a return signal above a threshold level, the step of emitting light from the plurality of laser emitters further comprising causing the laser emitters to emit pulses of a reduced power level when at least one of the avalanche photodiode detectors detects a return signal above a threshold level.

24. The method of claim 19, wherein the lidar system further comprises a processor in signal communication with the plurality of avalanche photodiode detectors and the plurality of laser emitters, the processor being configured to prevent the laser emitters from firing when the rotary component is not rotating, the step of emitting light from the plurality of laser emitters further comprising causing the laser emitters to emit light only when the rotary component is rotating.

25. The method of claim 19, wherein the lidar system further comprises a processor in signal communication with the plurality of avalanche photodiode detectors and the plurality of laser emitters, the processor being configured to control the firing of the laser emitters in relation to the rotation of the rotary component, the step of emitting light from the plurality of laser emitters further comprising causing the laser emitters to emit light only when the rotary component is rotating above a threshold level.

* * * * *